United States Patent [19]

Kuhn

[11] Patent Number: 5,633,585
[45] Date of Patent: May 27, 1997

[54] MR METHOD FOR DETERMINING THE NUCLEAR MAGNETIZATION DISTRIBUTION BY MEANS OF A SURFACE COIL ARRANGEMENT

[75] Inventor: Michael Kuhn, Hamburg, Germany

[73] Assignee: U.S. Philips Corporation, New York, N.Y.

[21] Appl. No.: 570,461

[22] Filed: Dec. 11, 1995

[30] Foreign Application Priority Data

Dec. 10, 1994 [DE] Germany ............... 44 44 061.8

[51] Int. Cl.$^6$ ............................................. G01V 3/00
[52] U.S. Cl. ............................. 324/307; 324/318
[58] Field of Search .................... 324/322, 318, 324/314, 309, 307; 128/653.5

[56] References Cited

U.S. PATENT DOCUMENTS

| | | | |
|---|---|---|---|
| 4,825,162 | 4/1989 | Roemer et al. | 324/318 |
| 4,885,541 | 12/1989 | Hayes | 324/318 |
| 5,086,275 | 2/1992 | Roemer | 324/322 |
| 5,208,534 | 5/1993 | Okamoto et al. | 324/309 |
| 5,248,943 | 9/1993 | Fox et al. | 324/322 |
| 5,280,246 | 1/1994 | Takahashi et al. | 324/322 |

FOREIGN PATENT DOCUMENTS

| | | |
|---|---|---|
| 0412824A2 | 2/1991 | European Pat. Off. . |
| 8905115 | 12/1988 | WIPO . |

OTHER PUBLICATIONS

Society for Magnetic Resonance Imaging, 8th Meeting, 1989 Oak Brook, USA, K. Okamoto et al, p. 953, *SNR Improvement with Multiple Surface Coils and Weighted Addition*.

Magnetic Resonance In Medicine 16, pp. 192–225 (1990), *The NMR Phased Array*, P.B. Romer, et al.

*Primary Examiner*—Louis M. Arana
*Attorney, Agent, or Firm*—Jack D. Slobod

[57] ABSTRACT

The invention relates to An MR method for determining the nuclear magnetization distribution in an examination zone, in which sub-image data are acquired by means of a surface coil arrangement comprising at least two surface coils and having a locally inhomogeneous sensitivity, MR superposition images being formed from said sub-image data by weighted summing. An as artefact-free as possible reproduction of MR superposition images is achieved in that the data of at least one sub-image acquired by means of a surface coil are multiplied by a further weighting function in such a manner that sub-image areas which contain artefacts are weighted less than areas without artefacts.

11 Claims, 1 Drawing Sheet ic # MR METHOD FOR DETERMINING THE NUCLEAR MAGNETIZATION DISTRIBUTION BY MEANS OF A SURFACE COIL ARRANGEMENT

BACKGROUND OF THE INVENTION

1. Field of the Invention

The invention relates to an MR method for determining the nuclear magnetization distribution in an examination zone, in which sub-image data are acquired by means of a surface coil arrangement which comprises at least two surface coils and which has a locally inhomogeneous sensitivity, MR superposition images being formed from said sub-image data by weighted summing.

2. Description of the Related Art

From German Patent Application P 44 27 429.7-33 it is known to acquire sub-image data for a respective sub-image by means of a respective surface coil and to combine these sub-images so as to form an MR superposition image (or overall image) by weighted summing.

The determination of the nuclear magnetization distribution in an examination zone by means of a surface coil arrangement comprising at least two, but in practice usually more than two surface coils, offers the advantage that the signal-to-noise ratio is substantially better than in the case of coils capable of receiving the resonance signals from the entire examination zone. It is a drawback of this method, however, that artefacts which are present in some sub-images only are superposed on the artefact-free sub-images upon combination of all sub-images into the overall image, so that these artefacts appear in the overall image.

Artefacts, for example motion artefacts, are often caused by local movement of anatomic structures, for example the (bright) fat of the abdomen during respiration, the pulsation of large blood vessels, or the "fresh" magnetic spins flowing into (essentially stationary) vessels within the slice reproduced. In dependence on the frequency of the motion, this causes stripes in Fourier methods which are continuous or consist of periodic repetitions (ghosts) of the moving object and which extend through the pixels concerned across the image. These stripes also cover remote areas and individual "ghosts" may imitate pathologies (metastases) (for example, in the liver) or compensate their contrast (when a bright artefact coincides with a low-signal metastasis of the same size).

SUMMARY OF THE INVENTION

It is an object of the present invention to improve a method of the kind set forth in such a manner that the MR superposition image is as free from artefacts as possible.

This object is achieved in accordance with the invention in that the data of at least one sub-image acquired by means of a surface coil are multiplied by a further weighting function in such a manner that sub-image areas containing artefacts are weighted less than areas without artefacts.

According to the known method, each sub-image is multiplied by a given weighting factor, after which all sub-images are superposed so as to form the MR superposition image. The method does not take into account artefacts and does not involve the display of individual sub-images prior to the superposition. In accordance with the method of the invention, at least one sub-image is multiplied by a further weighting function. As As a result, when the weighting function is suitably chosen, areas of a sub-image in which the intensity of pixels is not based on a measured signal but on an artefact, for example, due to the inhomogeneity of the sensitivity of the associated surface coil, are weighted less than areas which are situated near the measuring surface coil and which can deliver a strong measuring signal. When an artefact is recognized in a sub-image, for example automatically or by observation of the sub-image by the radiologist, the weighting function for this sub-image can be adapted accordingly, so that the disturbing superposition of the artefacts in other sub-images is avoided.

In a preferred version of the invention, the weighting function corresponds to the sensitivity function or to a power of the sensitivity function of the surface coil whose sub-image data are multiplied by this weighting function. The sensitivity function of a surface coil may be known, for example from theoretical (Biot-Savart) calculations or from measurements performed on a homogeneous phantom object. As the power of the sensitivity function which is used as the weighting function is increased, pixels at an increasingly greater distance from the coil are suppressed more strongly. The intensity of pixels for which the sensitivity of the surface coil has decreased strongly is reduced to such a great extent that their superposition on other sub-images is no longer disturbing after the combination of the sub-images into the overall image, so that artefacts are not be superimposed in the overall image either.

In a further version, areas of an MR superposition image are formed exclusively by sub-image data acquired by one or more surface coils having covered these selected areas with the best signal-to-noise ratio. If a given area is to be reproduced particularly clearly during observation of an overall image, it is possible during the viewing of this area to suppress as many superposition contributions as possible, or all superposition contributions, from other sub-images which could mask image parts in this area due to artefacts whereas the other areas of the overall image are reproduced as a superposition of all sub-images.

The formation of MR images by means of a surface coil arrangement has a drawback in that the sensitivity (the - location-dependent - sensitivity of an MR coil is defined as the quotient of the magnetic induction in a given location and the current in the coil which produces the magnetic induction in this location) is locally inhomogeneous, i.e. dependent on the location in the examination zone from which the MR signal arises. In order to compensate the location-dependent sensitivity differences, therefore, in a further embodiment of the invention auxiliary values for correcting the sub-image data of the surface coils are derived by means of a body coil arrangement having a locally approximately homogeneous sensitivity.

An MR arrangement for carrying out the method of the invention, comprising a) a surface coil arrangement comprising at least two coils, b) processing means for means for generating MR images from the MR signals received by the surface coil arrangement, c) programmable control means for controlling the temporal variation of the magnetic fields acting on the examination zone and for controlling the MR signal processing, also comprises further control means for controlling the weighting functions of the sub-image data.

In a further embodiment of the invention there is provided a body coil arrangement having a locally at least approximately homogeneous sensitivity in order to derive data for the calculation of auxiliary values for correcting sub-image data.

These and other aspects of the invention will be apparent from and elucidated with reference to the embodiments described hereinafter.

DETAILED DESCRIPTION OF THE PREFERRED EMBODIMENTS

Figure 1:
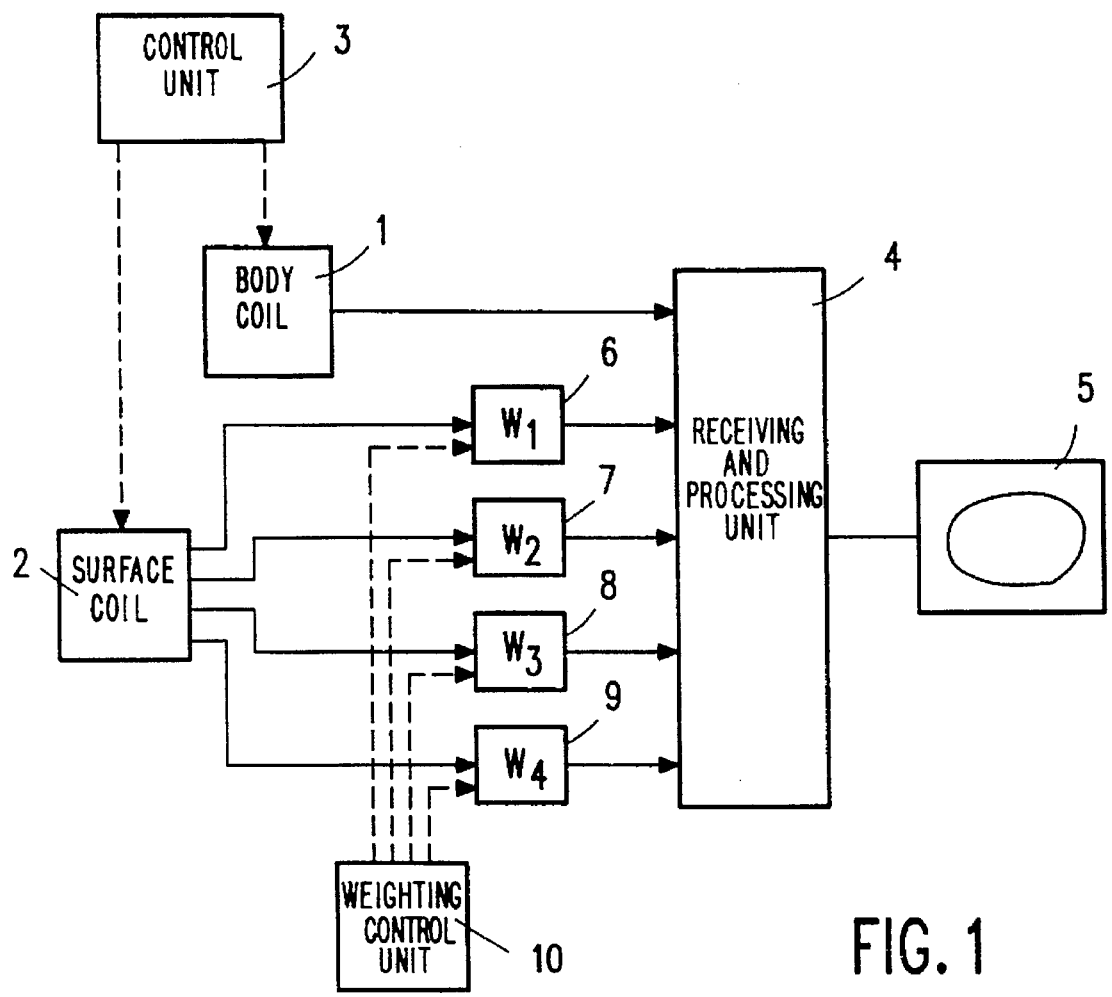
FIG. 1 shows a block diagram of an MR examination apparatus in which the invention can be implemented.

The reference numeral 1 in the block diagram of FIG. 1 denotes a body coil arrangement which has a conventional cylindrical construction and encloses the body of a patient over a given length during an MR examination. The reference numeral 2 denotes a surface coil arrangement consisting of a plurality of surface coils. The two coil arrangements 1 and 2 are controlled by the control unit 3 in the transmission mode and the receiving mode.

For each coil of the surface coil arrangement 2 and the body coil arrangement 1, receiving and processing unit 4 comprises a respective channel in which the MR signal received by the relevant coil is amplified, transposed to a lower frequency range and digitized, and in which a respective MR image can be reconstructed from the digitized MR signals. The MR images formed in the receiving and processing unit 4 can be displayed on a monitor 5.

Usually, only one of the coil arrangements 1 and 2 is active at any time. When the MR signals are to be received by the body coil arrangement 1, the coils of the surface coil arrangement 2 are detuned by the control unit 3, and when reception is to take place by the surface coil arrangement 2, the body coil arrangement 1 is detuned. The coil arrangements are thus inductively decoupled from one another.

For further steps of an MR method for determining the nuclear magnetization distribution reference is made to the cited state of the art.

In each channel from the surface coil arrangement 2 to the receiver unit 4 there is included a weighting unit 6 . . . 9 whereby the sub-image data in each channel can be multiplied by a weighting function $W_1 \ldots W_4$. The weighting functions $W_1 \ldots W_4$ can be influenced by way of a weighting control circuit 10.

Figure 2:
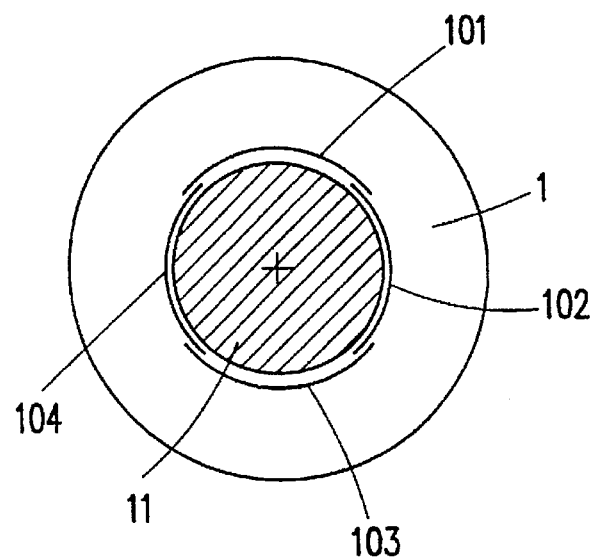
FIG. 2 shows a body coil arrangement and a surface coil arrangement.

FIG. 2 shows the position in space of the body coil arrangement 1, for example being a coil of the bird-cage type, as well as of the surface coil arrangement which consists of several (four in the present example) individual surface coils 101 . . . 104. The four surface coils 101 to 104 may be arranged on a flexible support (not shown) which is wrapped around the patient 11. The coils are arranged on the support in such a manner that they overlap in a defined area, so that suitable decoupling is achieved between these surface coils.

If the sensitivity profiles of the surface coils are known, they can be used as weighting functions $W_1 \ldots W_4$. The intensity of pixels situated further from a surface coil is reduced in comparison with that of pixels situated nearer to a surface coil. If this effect is to be intensified, instead of the sensitivity function its square, or a higher power thereof, can be used as the weighting function in each channel.

The weighting control circuit 10 may also include a user interface via which the user can change, for example the power of the weighting function in each channel separately.

Preferably, the weighting function can also be modified at random via the weighting control circuit 10. It can thus be prevented that areas of the overall image which have been weighted only insignificantly in all sub-images because of remoteness from the surface coils no longer carry image information, for example by increasing the weighting of such areas in the sub-images.

In one version of the method, the receiving and processing unit 4 initially reproduces all sub-images separately and successively on the monitor 5. The user can subsequently select the weighting function of each individual sub-image (for example, from a set of weighting functions presented), or modify it such a manner, that areas of a sub-image in which artefacts occur are weighted less than areas without artefacts.

Separating lines between areas with and areas without artefacts in a subimage can either be inserted by the user or be automatically inserted if the sensitivity function of the relevant surface coil is known. For a separating line use is ideally made of a line on which the surface coil exhibits the same sensitivity throughout. Preferably, the weighting function does not exhibit a function jump near separating lines but constitutes a continuous function which is adapted to the separating line, as otherwise disturbing separating lines would remain visible in the overall image displayed.

Via a further user interface (not shown), for example a computer mouse for cursor positioning or for shifting a window on the display screen, the user can select an area of the overall image which is to be studied particularly closely. The receiver unit 4 then selects that one of the individual surface coils which has covered the desired image area with the best signal-to-noise ratio and/or checks whether this signal-to-noise ratio is high enough, for example higher than a predetermined threshold value. The desired image area is then reproduced only by the sub-image of the selected surface coil, the remainder of the overall image being displayed as a superposition of all sub-images. It is thus ensured that no artefacts from other sub-images can be superposed on the image area which is studied more closely.

I claim:

1. An MR method for determining the nuclear magnetization distribution in an examination zone, in which sub-image data for a plurality of sub-images is acquired from a surface coil arrangement which comprises a respective plurality of surface coils, each having a locally inhomogeneous sensitivity function, MR superposition images being formed from said sub-image data by weighted summing, characterized in that prior to the formation of said MR superposition images, sub-images are formed and displayed, and weighting functions for sub-images containing artefacts are selected by a user in such a manner that sub-image areas containing artefacts are weighted less than sub-image areas without artefacts.

2. An MR method as claimed in claim 1, characterized in that the weighting function applied to a sub-image corresponds to the sensitivity function or to a power of the sensitivity function of the surface coil from which the data for that sub-image is acquired.

3. An MR method as claimed in claim 2, characterized in that auxiliary values for correcting the sub-image data of the surface coils are derived by means of a body coil arrangement having a locally approximately homogeneous sensitivity function.

4. An MR method as claimed in claim 2, characterized in that areas of an MR superposition image are formed exclusively by sub-image data acquired by one or more of the plurality of surface coils having a sensitivity function covering these selected areas with the best signal-to-noise ratio.

5. An MR method as claimed in claim 4, characterized in that auxiliary values for correcting the sub-image data of the surface coils are derived by means of a body coil arrangement having a locally approximately homogeneous sensitivity function.

6. An MR method as claimed in claim 1, characterized in that areas of an MR superposition image are formed exclusively by sub-image data acquired by one or more of the plurality of surface coils having a sensitivity function covering these selected areas with the best signal-to-noise ratio.

7. An MR method as claimed in claim 6, characterized in that auxiliary values for correcting the sub-image data of the surface coils are derived by means of a body coil arrangement having a locally approximately homogeneous sensitivity function.

8. An MR method as claimed in claim 1, characterized in that the weighting functions are selected from a set of weighting functions or can be modified.

9. An MR method as claimed in claim 1, characterized in that auxiliary values for correcting the sub-image data of the surface coils are derived by means of a body coil arrangement having a locally approximately homogeneous sensitivity function.

10. An MR arrangement, comprising:

a) a surface coil arrangement comprising a plurality of surface coils for receiving MR signals to provide sub-image data for a respective plurality of sub-images, b) a display, c) means for generating the sub-image data from the MR signals received by the surface coil arrangement for determining sub-images from the sub-image data and causing the sub-images to be displayed on the display to a user, for receiving selections from the user of weighting functions to be applied to sub-images having artefacts in a manner that sub-image areas containing artefacts are weighted less than sub-image areas without artefacts, for applying the weighting functions to the sub-images determined from said sub-image data to form weighted sub-images, and for summing the weighted sub-images, and d) programmable control means for controlling the temporal variation of magnetic fields acting on an examination zone and for controlling processing of the MR signals.

11. An MR arrangement as claimed in claim 10, characterized in that there is provided a body coil arrangement having a locally at least approximately homogeneous sensitivity in order to derive data for the calculation of auxiliary values for correcting sub-image data.

* * * * *